(12) United States Patent  
Van Bossuyt

(10) Patent No.: US 7,819,235 B2  
(45) Date of Patent: Oct. 26, 2010

(54) VENTURI VACUUM GENERATOR ON AN ELECTRIC COMPONENT HANDLER

(75) Inventor: Douglas Van Bossuyt, Newberg, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 774 days.

(21) Appl. No.: 11/750,375

(22) Filed: May 18, 2007

(65) Prior Publication Data

US 2008/0179224 A1 Jul. 31, 2008

Related U.S. Application Data

(60) Provisional application No. 60/887,105, filed on Jan. 29, 2007.

(51) Int. Cl.
*B65G 17/46* (2006.01)

(52) U.S. Cl. .................... 198/471.1; 209/573

(58) Field of Classification Search .......... 198/393, 198/471.1; 209/573, 905; 324/755
See application file for complete search history.

(56) References Cited

U.S. PATENT DOCUMENTS

| | | | | |
|---|---|---|---|---|
| 5,117,962 A | * | 6/1992 | Tommarello et al. | 198/378 |
| 5,469,953 A | * | 11/1995 | Igarashi et al. | 198/345.2 |
| 5,686,833 A | * | 11/1997 | Spinner | 324/158.1 |
| 5,842,579 A | | 12/1998 | Garcia et al. | |
| 5,942,906 A | * | 8/1999 | Stowers et al. | 324/761 |
| 6,194,679 B1 | * | 2/2001 | Garcia et al. | 209/571 |
| 6,204,464 B1 | | 3/2001 | Garcia et al. | |
| 6,710,611 B2 | * | 3/2004 | Saulnier et al. | 324/755 |
| 6,906,508 B1 | * | 6/2005 | Saulnier et al. | 324/158.1 |
| 6,942,086 B2 | * | 9/2005 | Bridges et al. | 198/377.08 |
| 7,017,731 B2 | * | 3/2006 | Ikeda et al. | 198/464.3 |
| 7,161,346 B2 | | 1/2007 | Fish et al. | |
| 7,390,158 B2 | * | 6/2008 | Takagi et al. | 414/222.01 |
| 7,592,823 B2 | * | 9/2009 | Garcia | 324/754 |

* cited by examiner

*Primary Examiner*—Douglas A Hess  
(74) *Attorney, Agent, or Firm*—Young Basile

(57) ABSTRACT

At least one venturi generator is provided for use with an electrical circuit component handler. The handler includes a stationary vacuum plate and a test plate. The vacuum plate includes vacuum channels, and the test plate includes test seats. The venturi generator is operative to create a vacuum pressure passed to the vacuum channels on the stationary vacuum plate and is used to draw electronic components into test seats on the test plate. The venturi generator may be the exclusive source of vacuum pressure or may supplement another vacuum source.

21 Claims, 5 Drawing Sheets

VENTURI VACUUM GENERATOR ON AN ELECTRIC COMPONENT HANDLER

FIELD OF THE INVENTION

This invention relates to an electronic circuit component handler and in particular a handler that includes a venturi generator to provide a vacuum to a plurality of electronic component test seats.

BACKGROUND

Electrical circuit component handlers are provided in the prior art. U.S. Pat. No. 5,842,579, entitled Electrical Circuit Component Handler and assigned to the assignee of the present application, describes one such circuit component testing machine.

With reference to FIG. 2, there is shown an overall pictorial view of the electrical circuit component handler of U.S. Pat. No. 5,842,579, the entirety of which is incorporated herein by reference. FIG. 2 illustrates a handler 10 having a loading frame 12 defining a loading zone 13, a plurality of test modules 14 defining a test zone 15 and a blow-off 16 defining a blow off zone 17. In operation, electronic components are passed through load frame 12 and are individually drawn into test seats 24 found on a test plate 20 with the assistance of a vacuum.

FIG. 3 illustrates a prior test plate 20. Test plate 20 includes concentric test seat rings 22. Each test seat ring 22 includes a plurality of test seats 24. Test seats 24 are defined by an aperture that passes through test plate 20.

With reference to FIG. 4, the underside of prior art test plate 20 is shown. A vacuum link 26 is provided for each test seat 24 such that vacuum link 26 and thus test seat 24 are exposed to a vacuum pressure.

With reference to FIG. 5, there is shown a stationary vacuum plate 30 that underlies test plate 20. Stationary vacuum plate 30 includes a plurality of vacuum channels 32 in which vacuum pressure is delivered so as to create vacuum pressure in test seats 24.

After the electronic components are drawn into test seats 24, handler 10 indexes test plate 20 so that the electronic components may be tested in the test zone 15. The electronic components are removed from test plate 20 in blow off zone 17. Subsequently the components are sorted according to the test results.

SUMMARY

An electric component handler is provided including a stationary vacuum plate, a test plate and at least one venturi generator. The stationary vacuum plate includes a plurality of concentric vacuum channels with the concentric vacuum channels preferably including a loading zone, a testing zone and a blow off zone. The test plate is preferably rotatably positioned adjacent to the stationary vacuum plate, and the test plate includes a plurality of concentric test seat rings. Each test seat ring includes a plurality of apertures for receiving electronic components to be tested. Each aperture has an associated vacuum link with each vacuum link being selectively proximate a vacuum channel. The venturi generator is in pneumatic communication with at least one of the vacuum channels.

The venturi generator may provide the exclusive source of vacuum for a vacuum channel or may provide a supplemental vacuum pressure during periods of peak demand.

It is also contemplated that the vacuum channels may be divided into three disparate zones, a loading zone, a testing zone and a blow off zone.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION

With reference to the figures where like elements are numbered alike, there is shown an electrical circuit component handler and sub-systems thereof. Under certain circumstances the vacuum available to draw electronic components into test seats may be difficult to control, or insufficient. In the first preferred embodiment a venturi generator may be used to create a vacuum exclusively in the loading zone. In a second preferred embodiment a venturi generator may be used to supplement a vacuum source during periods of peak vacuum demand.

Vacuum sources used to create vacuum pressure in electrical circuit component handlers may be found in the facility where the handler is installed. Alternately the vacuum source may be a vacuum pump found onboard handler 10. Sometimes the vacuum source may be comparatively weak. The strength of the available vacuum source may limit the number of test seats on a test plate. Under certain circumstances the vacuum pressure may be difficult to control, for example for reasons relating to vacuum head room. Vacuum pressure problems may affect the efficiency of handlers or may result in damaged electronic components. For example, it is preferred to have a vacuum pressure in the loading zone of approximately −2 PSI. If there is insufficient vacuum pressure the vacuum pressure may be insufficient to draw electronic components into the test seats that are found in the loading zone. If the vacuum pressure is too high, additional electronic components may be drawn to a test seat. Neither of these situations is desirable.

Figure 1:
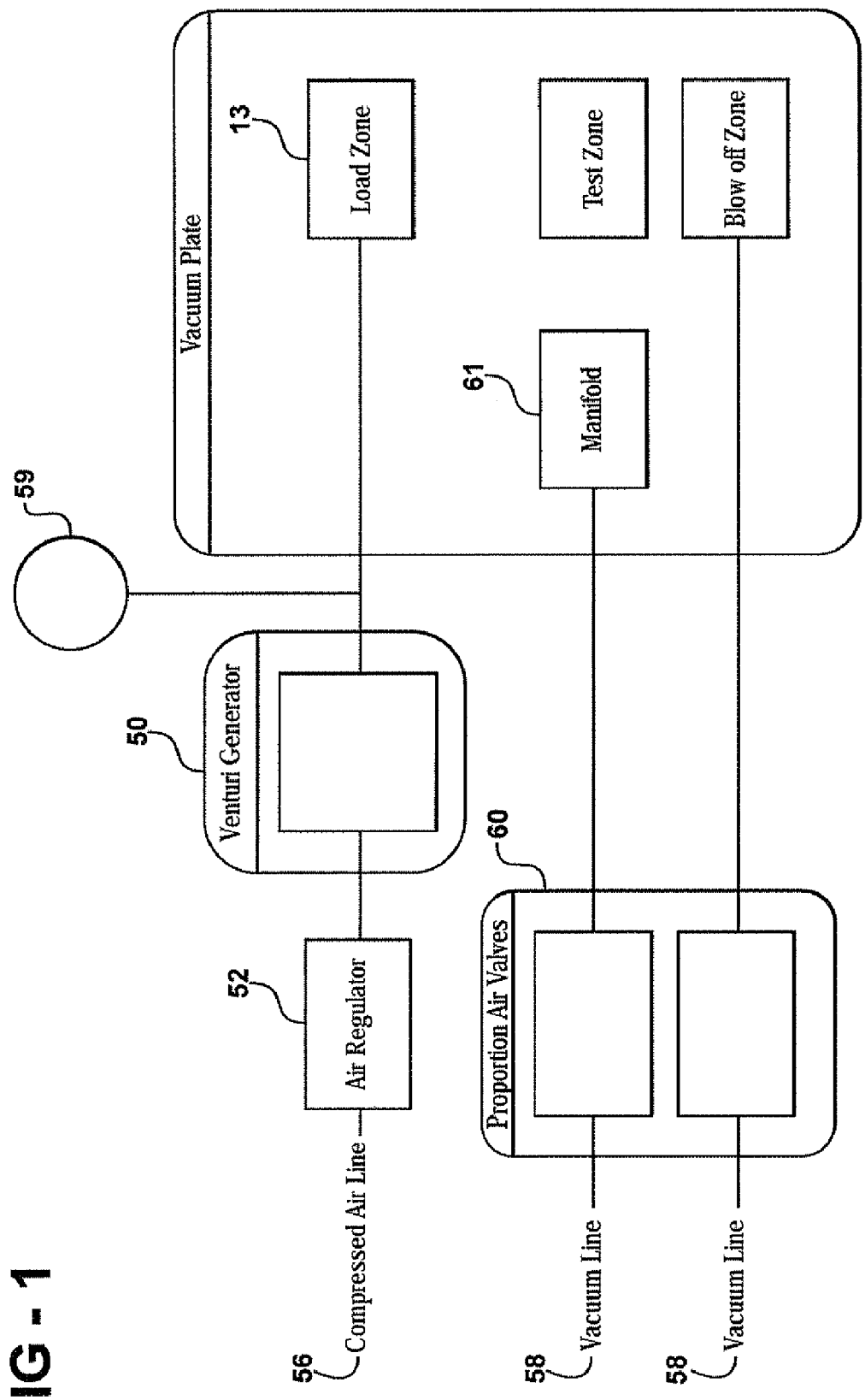
FIG. 1 is a schematic illustration of a first preferred embodiment of the present invention.
Figure 2:
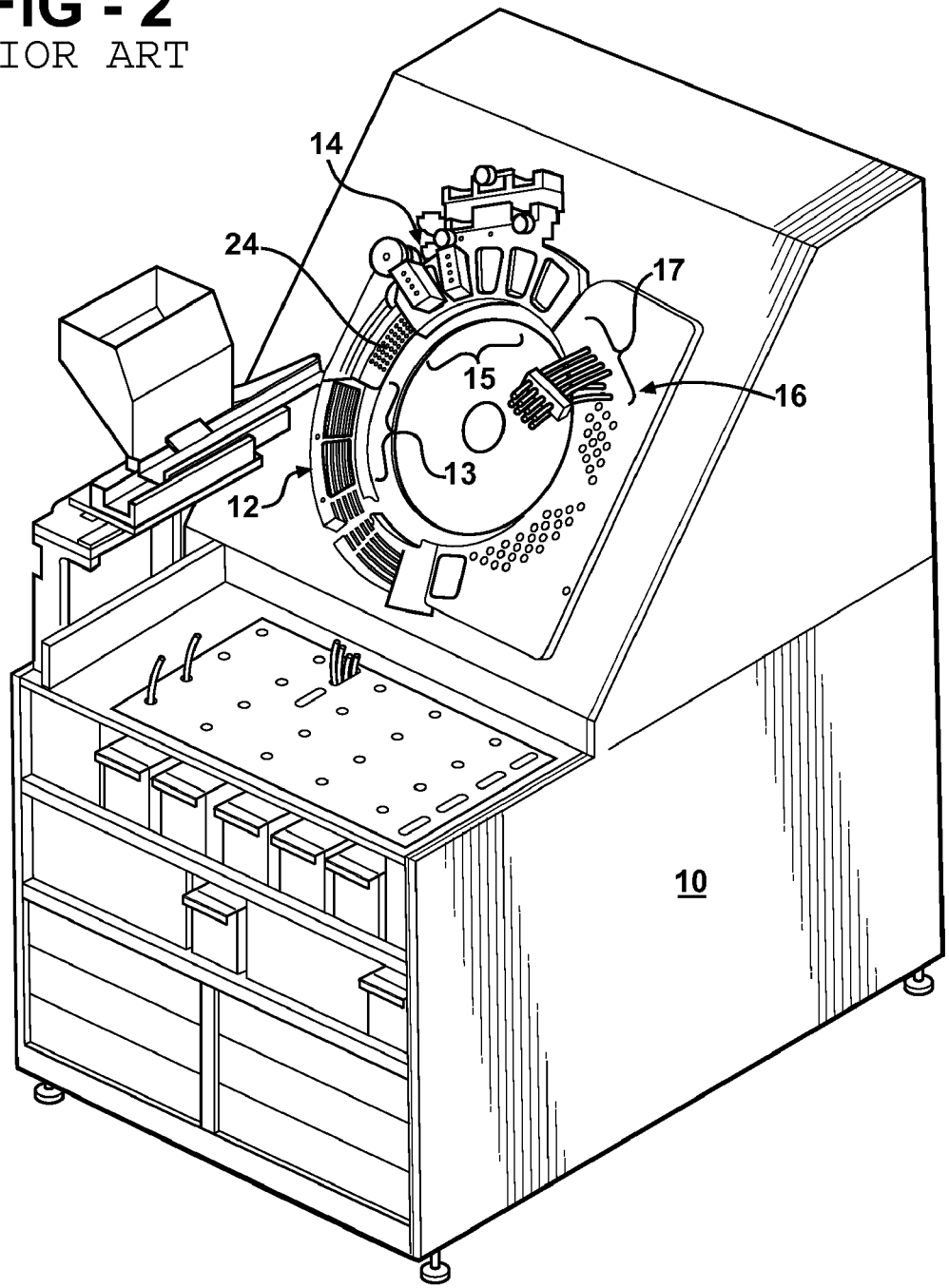
FIG. 2 is pictorial view of the basic structure of prior art electrical circuit component handler.
Figure 3:
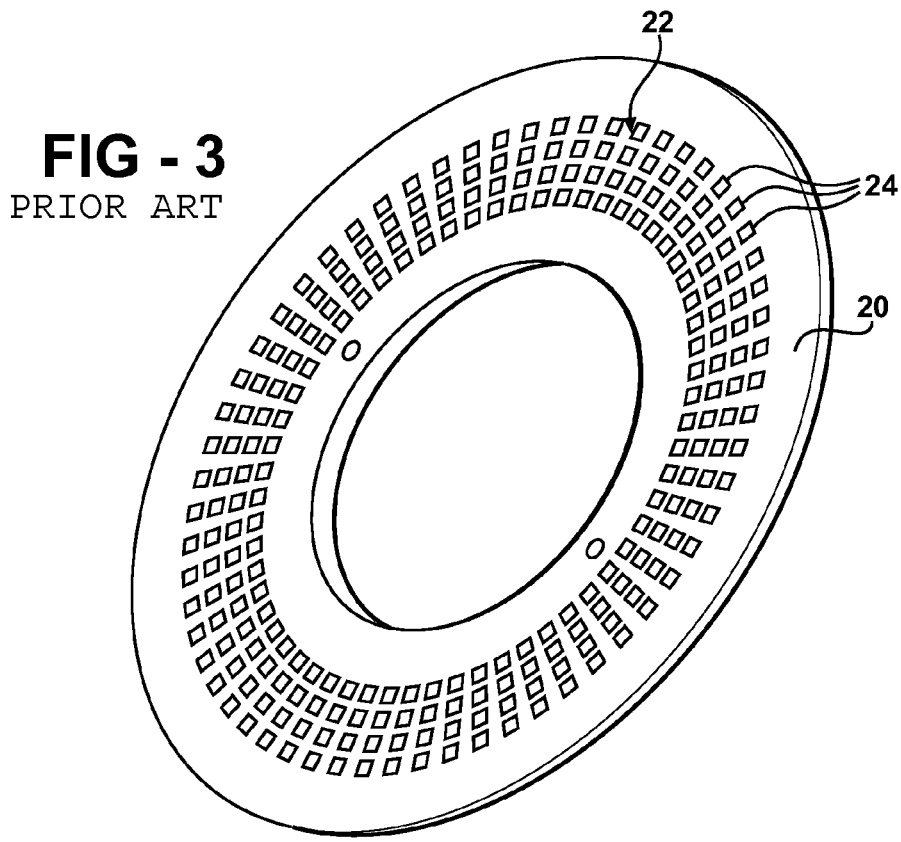
FIG. 3 is a pictorial view of a prior art test plate.
Figure 4:
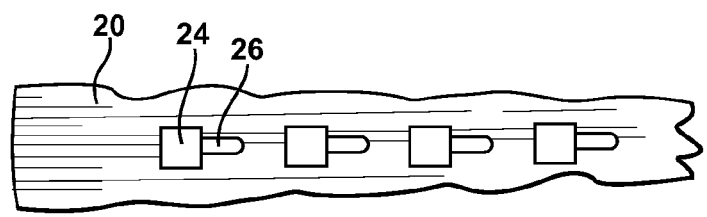
FIG. 4 is a partial view of an underside of a prior art test plate.
Figure 5:
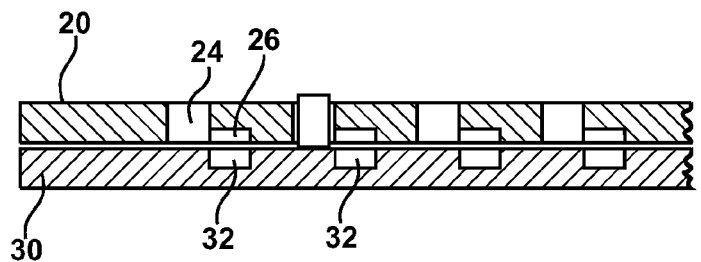
FIG. 5 is a partial cross-sectional view of a test plate taken along a radial line extending medially through a prior art test plate.

With reference to FIG. 1 there is shown a venturi generator 50 to provide a controlled vacuum amount to the loading zone 13. In the first preferred embodiment, venturi generator 50 may operate independently of the vacuum found in vacuum lines 58 insofar as venturi generator 50 receives air from a compressed air line 56. Compressed air line 56 delivers compressed air to an air regulator 52 which may control the air provided to venturi generator 50 so as to regulate vacuum pressure at loading zone 13. In the first preferred embodiment, venturi generator 50 draws a vacuum into those test seats 24 found in loading zone 13.

A gauge 59 may measure the vacuum pressure in loading zone 13 so as to control the vacuum pressure found in loading zone 13. In the first preferred embodiment the approximate preferred vacuum pressure is −2 PSI. Thus, when test seats 24 found in the loading zone 13 are substantially empty, vacuum demand peaks and air regulator 52 will allow more compressed air to pass to venturi generator 50. Conversely, when the test seats 24 in loading zone 13 are mostly occupied, the air flow to achieve the preferred approximate −2 PSI pressure is less, and thus the regulator 52 restricts air flow to maintain the preferred −2 PSI. In the first preferred embodiment venturi generator 50 is available from Vaccon as part no. CDF 500H.

With continued reference to FIG. 1 the vacuum pressure provided in the test zone 15 and blow-off zone 17 may be provided utilizing vacuum lines 58. Rather than using vacuum lines 58, a vacuum pump, not shown, may be used. The approximate preferred vacuum pressures in testing zone 15 and blow-off zone 17 is −5.8 PSI. The vacuum pressure may be controlled in test zone 15 and blow-off zone 17 by use of proportional valves 60.

One or more manifolds 61 may be used to convey vacuum pressure into the vacuum channels.

Figure 6A:
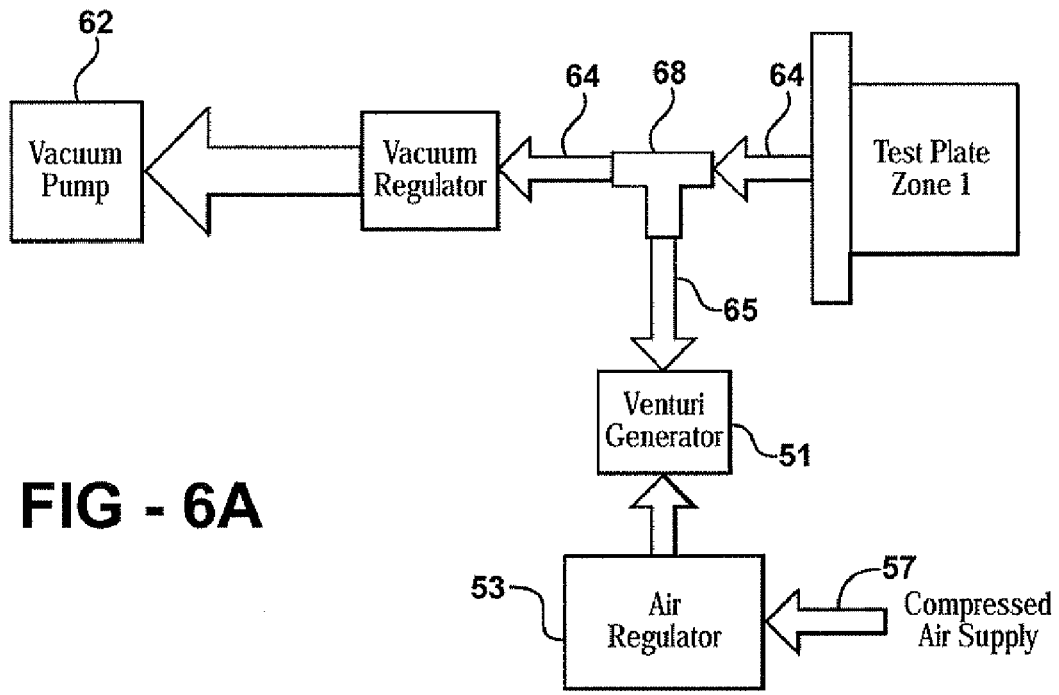
FIGS. 6A and 6B are schematics illustrating a second preferred embodiment of the present invention.
Figure 6B:
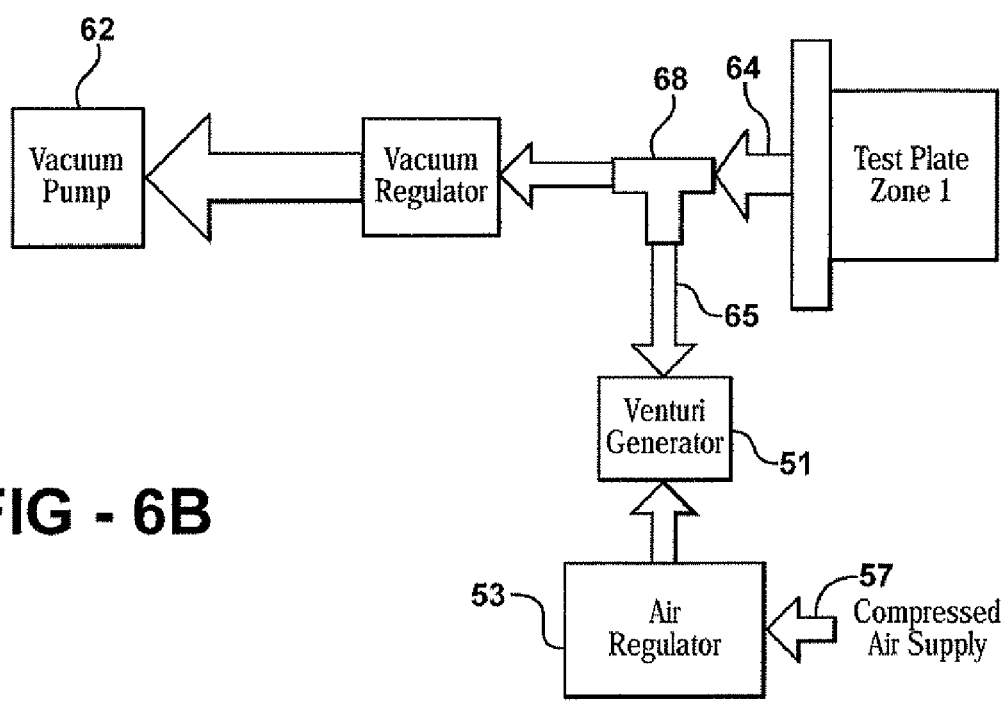

With reference to FIGS. 6A and 6B there is shown a second preferred embodiment where a venturi generator 51 may be used to selectively provide boost to the vacuum pressure generated by a vacuum pump 62 during periods of peak demand. These periods of peak demand may be caused by a test plate having a comparatively large number of open test seats 24. In particular, a T joint 68 may be positioned in a vacuum line 64. T joint 68 may be pneumatically connected to venturi generator 51. A compressed air line 57 may deliver compressed air to an air regulator 53 so as to control the amount of vacuum delivered by venturi generator 51. FIG. 6A illustrates vacuum lines as darkened lines to indicate air flow. In FIG. 6A, vacuum line 65 is not darkened, and venturi generator 51 provides no boost. As shown, no vacuum boost is provided because air regulator 53 is closed. FIG. 6B illustrates venturi generator 51 providing a boost. In particular, air regulator 53 moves to an open position wherein venturi generator 51 may draw additional vacuum.

Figure 7:
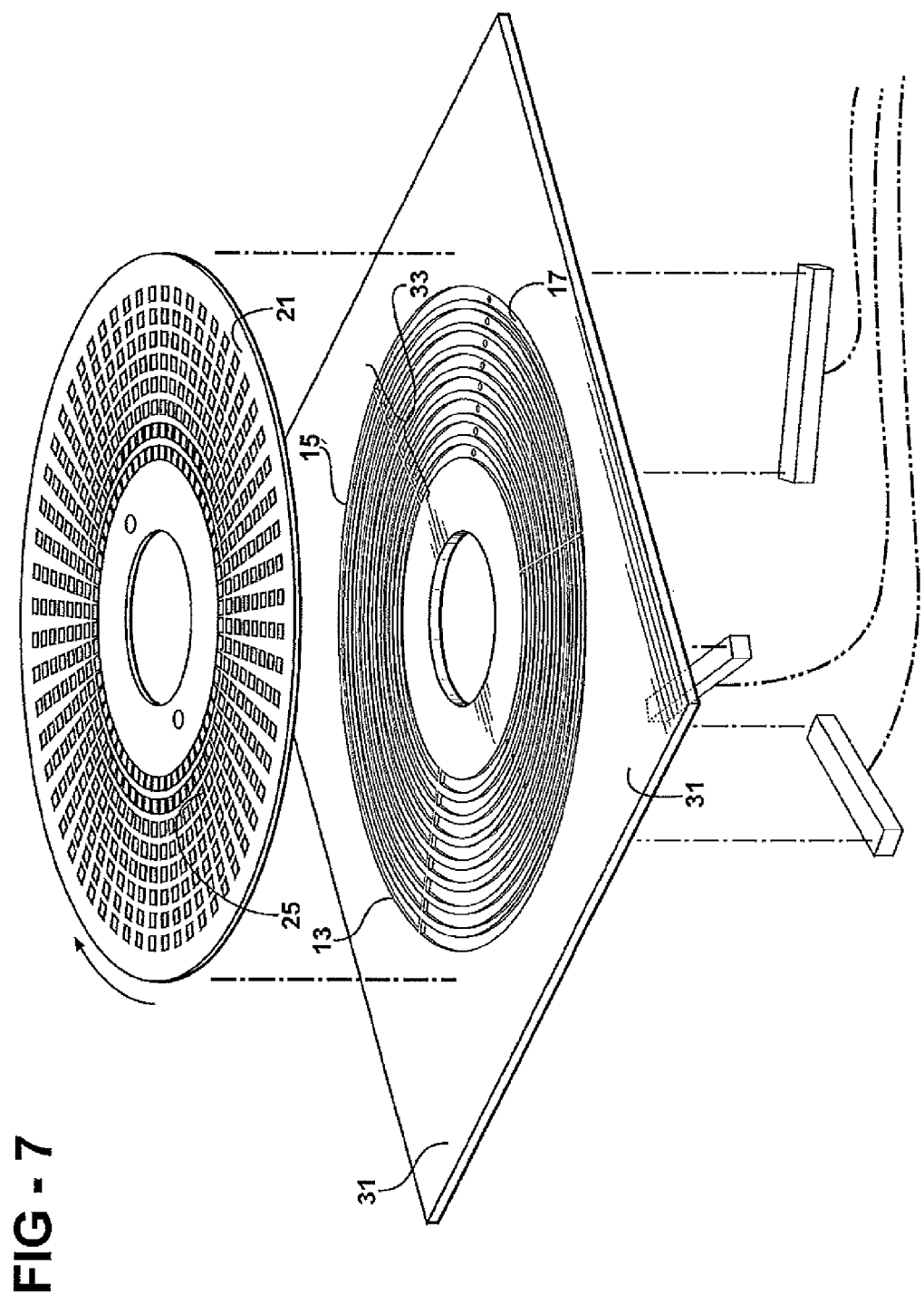
FIG. 7 is an exploded view of a test plate and stationary vacuum plate of a first or second preferred embodiment of the present invention.

With reference to FIG. 7, there is shown an exploded view of a test plate 21 and stationary vacuum plate 31 that may be used with either the first or second preferred embodiments or other embodiments. Test plate 21 includes a substantially greater number of test seats 24 as compared to the test plate 20 of the prior art. Stationary vacuum plate 31 includes a plurality of concentric vacuum channels 33. As illustrated, concentric vacuum channels 33 are in disparate sections corresponding to loading zone 13, testing zone 15 and blow off zone 17. Test plate 21 may be mounted on a component handler above stationary vacuum plate 31 such that a vacuum is drawn into all of the test seats 25. By providing three disparate sections for each vacuum channel 33, the vacuum pressures in the loading zone, testing zone and blow off zone may be independently controlled.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. An electronic component handler having a vacuum plate and a test plate, the vacuum plate including a plurality of vacuum channels positioned on an upper face of the vacuum plate and the test plate including a plurality of test seats, each test seat forming an aperture in the test plate and the test plate being positioned relative to the vacuum plate so as to convey a vacuum pressure into each test seat, the improvement comprising:
 a plurality of vacuum linking channels on an underside of the test plate and linked to respective test seats; and
 a venturi generator pneumatically connected to the vacuum plate and configured to draw a vacuum into at least one of the plurality of vacuum channels; wherein each of the plurality of vacuum channels is discontinuous and separated into one of multiple zones including at least a loading zone, a testing zone and a blow off zone.

2. The electronic component handler as in claim 1, further comprising:
 a vacuum source pneumatically connected to the vacuum plate; and
 wherein the venturi generator is configured to supplement the vacuum source during peak demand.

3. The electronic component handler as in claim 2 wherein the vacuum source is a vacuum pump.

4. The electronic component handler as in claim 1 wherein a separate venturi generator exists for each of the loading zone, testing zone and blow off zone.

5. The electronic component handler as in claim 4 wherein a vacuum pressure in the vacuum channels corresponding to the loading zone is less than a respective vacuum pressure in the vacuum channels corresponding to the testing zone and the blow off zone.

6. The electronic component handler as in claim 1 wherein the venturi generator is a sole source of vacuum pressure to the vacuum plate.

7. The electronic component handler as in claim 1 wherein the venturi generator is configured to simultaneously supply a vacuum to the loading zone, the testing zone and the blow off zone, the handler further comprising:
 at least one proportional valve controlling the vacuum pressure in the testing zone and the blow off zone.

8. The electronic component handler as in claim 1 wherein the venturi generator is coupled to the loading zone and further comprising:
 an air regulator controlling air provided to the venturi generator so as to regulate vacuum pressure of those of the plurality of vacuum channels forming the loading zone.

9. The electronic component handler as in claim 8 wherein a vacuum source separate from the venturi generator is coupled to the testing zone and the blow off zone and further comprising:
 at least one valve controlling vacuum pressure in the testing zone and blow off zone.

10. An electronic component handler comprising:
 a stationary vacuum plate including a plurality of concentric vacuum channels; the concentric vacuum channels including a loading zone, a testing zone and a blow off zone;
 a test plate rotatably positioned adjacent to the stationary vacuum plate and including a plurality of concentric test seat rings, each test seat ring including a plurality of apertures for receiving electronic components to be tested, each aperture having an associated vacuum link, and each vacuum link being selectively proximate a vacuum channel associated with one of the vacuum channels; and at least one venturi generator in pneumatic communication with at least one of the vacuum channels; wherein the venturi generator is configured to supplement vacuum pressure during periods of peak demand.

11. The electronic component handler as in claim 10 wherein a single venturi generator is configured to draw a vacuum in all of the vacuum channels in the loading zone.

12. The electronic component handler as in claim 11 wherein the vacuum channels in the testing zone are disparate from the vacuum channels in the blow off zone.

13. The electronic component handler as in claim 12 wherein vacuum pressure in the loading zone is less than vacuum pressure in the testing zone.

14. The electronic component handler as in claim 10, further comprising:
 a vacuum line coupled to the vacuum plate;
 a junction in the vacuum line wherein the venturi vacuum is pneumatically connected to the junction;
 a vacuum source separate from the venturi vacuum and coupled to the junction; and
 an air regulator selectively allowing the venturi vacuum to drawn a vacuum.

15. The electronic component handler of claim 14 wherein the vacuum source is a vacuum pump.

16. A method of controlling an electronic component handler including a vacuum plate and a test plate, the vacuum plate including a plurality of vacuum channels positioned on an upper face of the vacuum plate and the test plate including a plurality of test seats, each test seat forming an aperture in the test plate and the test plate being positioned relative to the stationary vacuum plate as to convey a vacuum pressure into each test seat, the method comprising:
 drawing a vacuum into at least one of the plurality of vacuum channels using a venturi generator pneumatically connected to the vacuum plate, wherein each test seat includes a vacuum linking channel on an underside of the test plate connecting the test seat to a respective vacuum channel and each of the plurality of vacuum channels is separated into a loading zone, a testing zone or a blow off zone; and supplying the vacuum pressure in the vacuum channels corresponding to the loading zone at a lower pressure than the vacuum pressure found in the vacuum channels corresponding to the testing zone and the blow off zone.

17. The method as in claim 16, further comprising:
simultaneously supplying vacuum pressure to the loading zone, the testing zone and the blow off zone.

18. The method as in claim 16, further comprising:
supplying the vacuum pressure to the loading zone, the testing zone and the blow off zone using a vacuum source other than the venturi generator; and
supplementing the vacuum source during peak demand using the venturi generator.

19. The method as in claim 16, further comprising:
supplying the vacuum pressure in the vacuum channels corresponding to the loading zone using the venturi vacuum; and
supplying the vacuum pressure in the vacuum channels corresponding to the testing zone and the blow off zone using a vacuum source separate from the venturi vacuum.

20. The method as in claim 19, further comprising:
regulating the vacuum pressure the vacuum channels corresponding to the loading zone by controlling air provided to the venturi generator using an air regulator.

21. The method as in claim 19, further comprising:
controlling the vacuum pressure in the vacuum channels corresponding to the testing zone and the blow off zone using at least one proportional air valve between the vacuum source and the vacuum plate.

* * * * *